(12) United States Patent
Efland et al.

(10) Patent No.: US 6,211,552 B1
(45) Date of Patent: Apr. 3, 2001

(54) RESURF LDMOS DEVICE WITH DEEP DRAIN REGION

(75) Inventors: Taylor R. Efland, Richardson; Sameer Pendharkar, Plano; Dan M. Mosher, Plano; Peter Chia-cu Mei, Plano, all of TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/320,953

(22) Filed: May 27, 1999

(51) Int. Cl.$^7$ .................................................. H01L 29/78
(52) U.S. Cl. ...................... 257/343; 257/336; 257/338; 257/408
(58) Field of Search ..................... 257/343, 336, 257/338, 344, 550, 408

(56) References Cited

U.S. PATENT DOCUMENTS

| 5,304,827 | * | 4/1994 | Malhi et al. . |
| 5,627,394 | | 5/1997 | Chang et al. ................... 257/335 |

* cited by examiner

Primary Examiner—George Fourson
Assistant Examiner—Joannie A. Garcia
(74) Attorney, Agent, or Firm—Wade James Brady, III; Frederick J. Telecky, Jr.

(57) ABSTRACT

A RESURF LDMOS transistor (32) has a drain region including a first region (24) and a deep drain buffer region (34) surrounding the first region. The first region is more heavily doped than the deep drain buffer region. The deep drain buffer region improves the robustness of the transistor.

9 Claims, 13 Drawing Sheets

DRAIN CURRENT Ids (A)

CURRENT IN SOURCE
TERMINALS (A)

RESURF LDMOS DEVICE WITH DEEP DRAIN REGION

FIELD OF THE INVENTION

This invention relates to semiconductor devices and, more particularly, to a RESURF (REduced SURf ace Field) LDMOS (lateral double-diffused "metal" N-oxide-semiconductor) device having a deep buffer implant in the drain region and method of fabrication thereof.

BACKGROUND OF THE INVENTION

LDMOS devices are the devices of choice in the 20–60V range. LDMOS devices are very easy to integrate into a CMOS or BiCMOS process thereby facilitating the fabrication of control, logic, and power switches on a single chip. In the 20–60V range, optimized LDMOS devices are also much more efficient in terms of on-state voltage and switching losses than power bipolar junction transistors or other hybrid MOSbipolar devices.

Optimized LDMOS design seeks to provide power switches with very low specific on-state resistance (Rsp) while maintaining high switching speed. A low Rsp helps reduce power losses as well as the size of the die. RESURF LDMOS or RLDMOS devices are very attractive in this respect as they offer very good trade-off between Rsp and breakdown voltage (BV) capability compared to non-RLDMOS devices. RLDMOS devices use the Reduced Surface electric field phenomenon to increase the drift region doping for a given breakdown voltage. The increased drift region doping causes reduction in the drift region resistance leading to an overall lower Rsp for the device.

As device size shrinks, the desire to maintain as wide a Safe Operating Area (SOA) as possible remains, since the applications these devices are used in remain the same. However, shrinking RESURF LDMOS device size has a negative impact on the robustness of the device. Accordingly, a need exists for a RESURF LDMOS device having improved robustness.

SUMMARY OF THE INVENTION

Applicants have discovered that factors contributing to the failure of conventional RLDMOS devices during reverse breakdown include the presence of a high electric field at the location where the RESURF region overlaps the n+drain region and a correspondingly high impact ionization rate near the drain region and low snap back current.

Generally, and in one form of the invention, a transistor includes:

- a semiconductor layer of a first conductivity type;
- a RESURF region of a second conductivity type formed in the semiconductor layer;
- a LOCOS field oxide region formed at a face of the RESURF region, the RESURF region being self-aligned to the LOCOS field oxide region;
- a well of the first conductivity type formed in the semiconductor layer;
- a source region of the second conductivity type formed in the well, a channel region defined in the well between a first edge of the source region and a first edge of the RESURF region;
- a drain region of the second conductivity type formed in the semiconductor layer adjacent a second edge of the RESURF region, the drain region including a first region extending from the face of the semiconductor layer to a first distance below the face of the semiconductor layer and a second region surrounding the first region and extending a second distance below the face of the semiconductor layer, the first distance being less than the second distance and the first region being more heavily doped than the second region; and
- a conductive gate formed over and insulated from the channel region.

BRIEF DESCRIPTION OF THE DRAWINGS

In the drawings.

Corresponding numerals and symbols in the different figures refer to corresponding parts unless otherwise indicated.

DETAILED DESCRIPTION OF THE PREFERRED EMBODIMENTS

Figure 1:
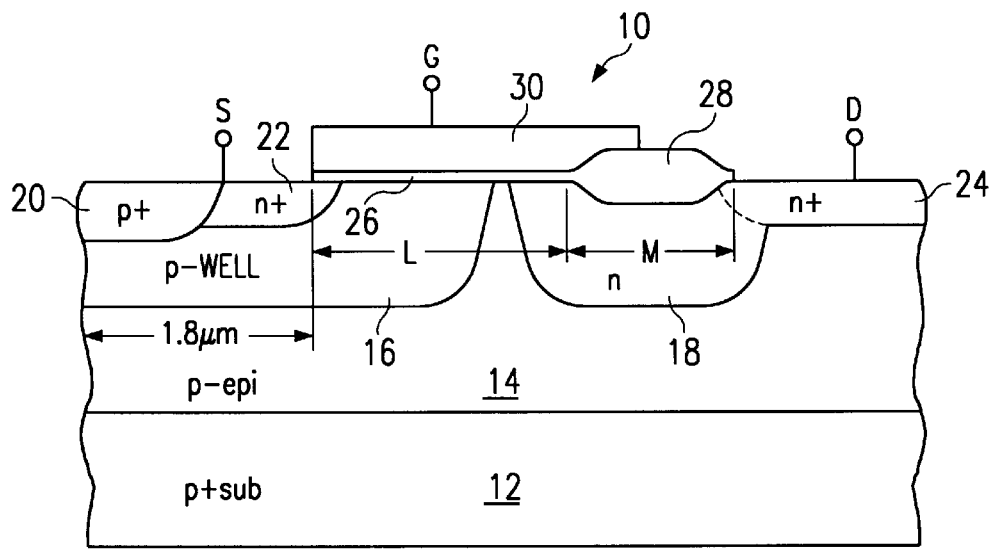
FIG. 1 is a cross-sectional elevation view of a RESURF LDMOS transistor according to the prior art.

FIG. 1 shows an RLDMOS transistor 10 according to the prior art. Transistor 10 is fabricated in a p- epitaxial layer 14 formed over p+substrate 12. Transistor 10 includes a p well 16 in epitaxial layer 14. An n+source region 22 and p+ backgate contact region 20 are formed in p well 16. Transistor 10 also includes n+ drain region 24 and an n type RESURF region 18 formed in epitaxial layer 14. RESURF region 18 is self-aligned to LOCOS field oxide region 28. A gate oxide layer 26 is formed at the face of epitaxial layer 14. Polysilicon gate 30 extends over gate oxide layer 26 and a portion of LOCOS field oxide region 28.

Figure 2:
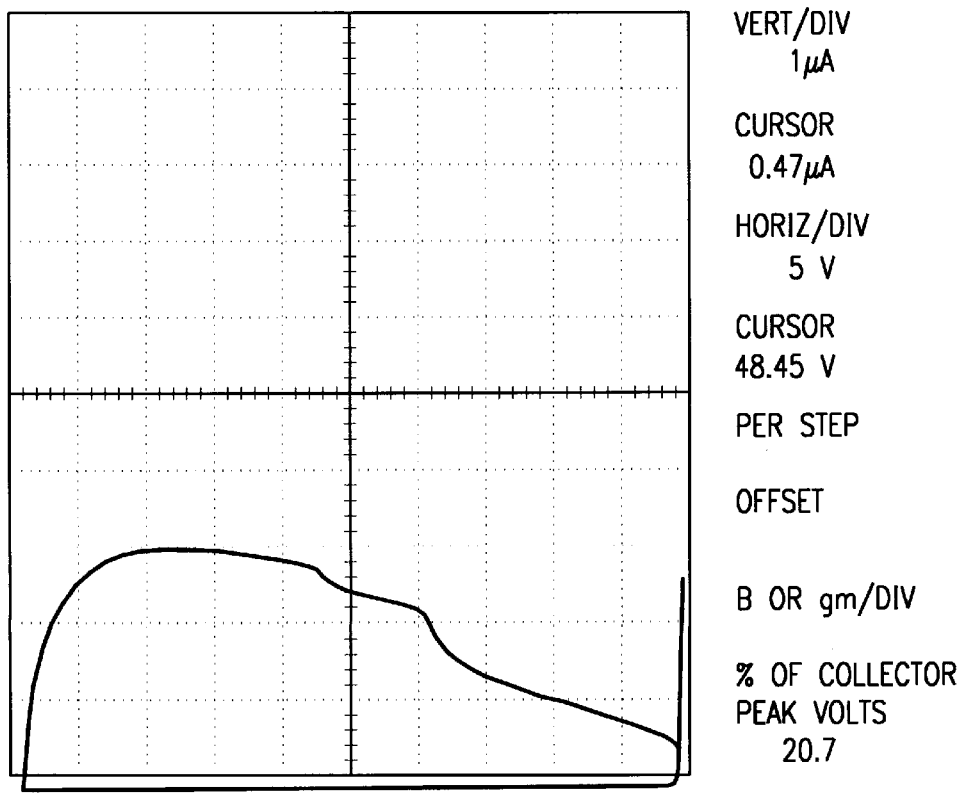
FIG. 2 shows the measured BV (breakdown voltage) curve at room temperature for a device according to FIG. 1.

FIG. 2 shows the measured BV (breakdown voltage) curve at room temperature for a device according to FIG. 1 having a distance L=3.3 microns, distance M=2.0 microns, and device area=8e−3 $cm^2$ with p- epi doping and n- type resurf implant dose chosen to obtain about 45V BVdss (drain-source breakdown voltage with gate shorted to source).

Figure 3:
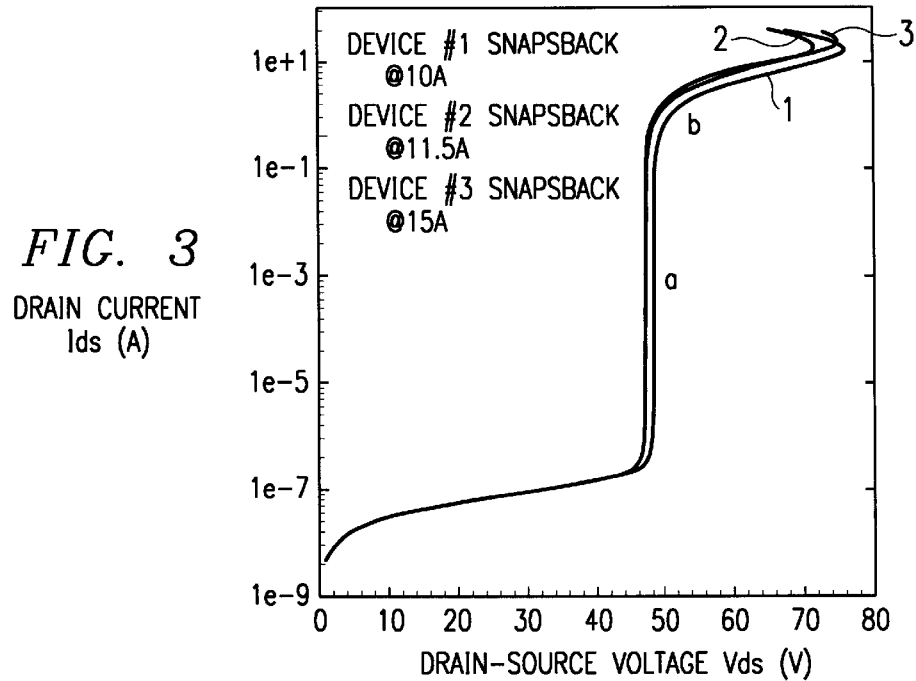
FIG. 3 shows a simulated BV curves at room temperature for the device of FIG. 1 and the device of FIG. 10.

FIG. 3 shows a simulated BV curve 1 at room temperature for the device of FIG. 1. As seen in FIG. 3, the device of FIG. 1 snaps back at about 10 amps around 70–75 volts. The primary reason for UIS (unclamped inductive switching) failure is non-uniform snap back in the device leading to current hogging and excessive heating.

Figure 4:
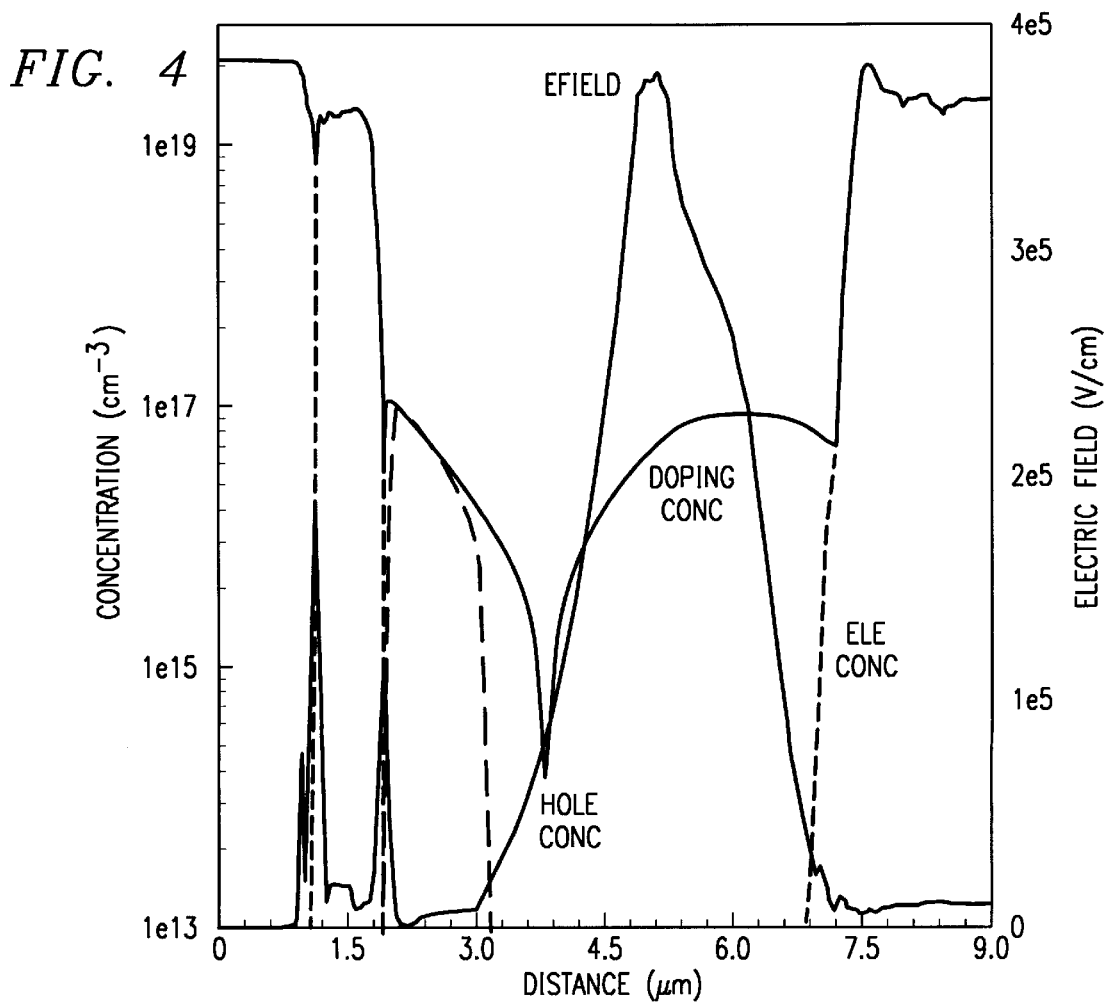
FIGS. 4–5 show plots of doping concentration, carrier concentration and electric field profiles in the device of FIG. 1 near the surface under different current conditions.

FIG. 4 shows a plot of doping concentration, carrier concentration and electric field profiles in the device of FIG. 1 near the surface under low current conditions (point a in FIG. 3). As can be seen in FIG. 4, there are no electrons and holes in the "depletion" region, where "depletion" region is defined as the region with the device where the bulk of the applied voltage drops. As such the electric field in the depletion region is determined solely by the doping concentrations. Due to the curvature near the bird's beak, the electric field is very high near the bird's beak. As a result there is a very high impact ionization generation rate near the bird's beak leading to the breakdown of the device.

Figure 5:
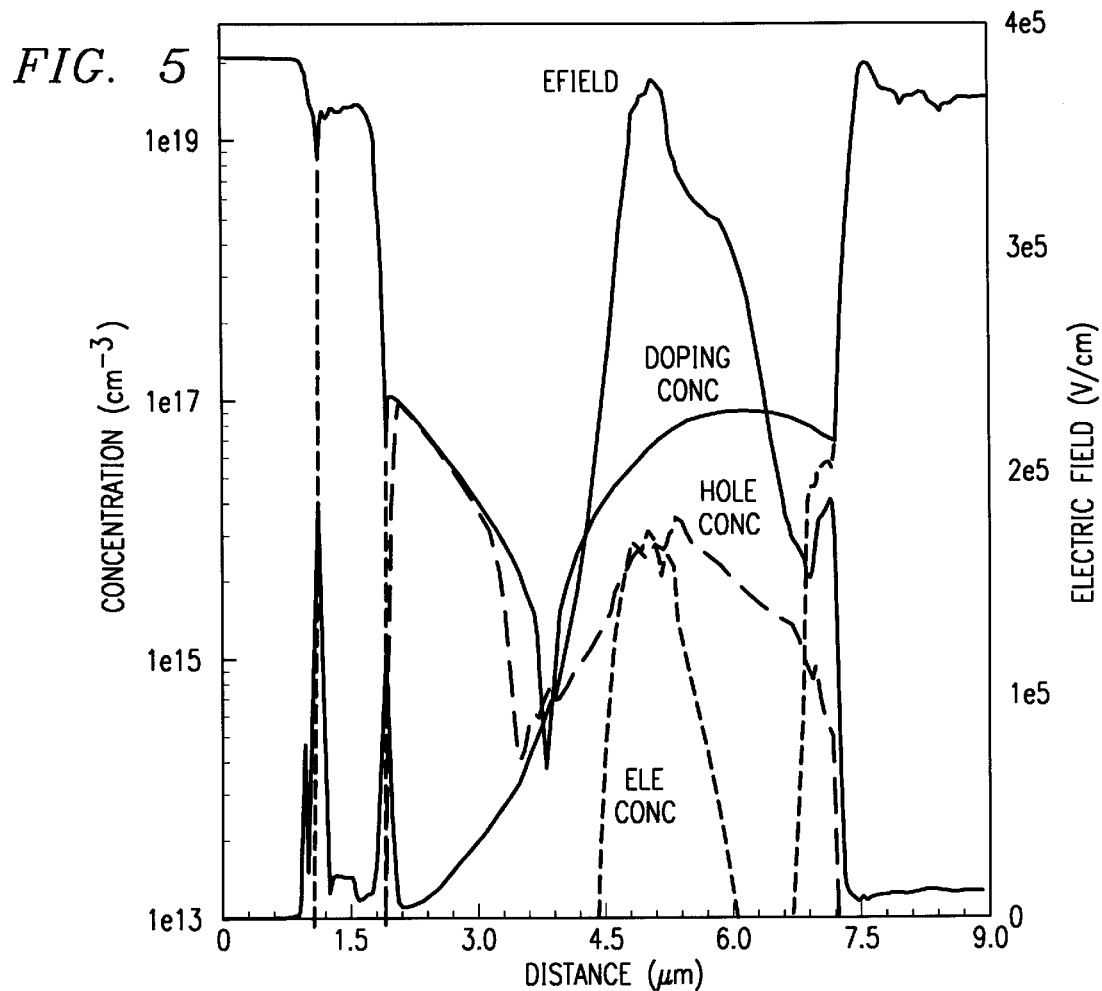

FIG. 5 shows a plot of doping concentration, carrier concentration and electric field profiles in the device of If FIG. 1 near the surface under high current conditions (point b in FIG. 3). As can be seen in FIG. 5, there is a significant concentration of electrons and holes in the depletion region. As such, the electric field distribution in the drift region is now determined by the sum total of charge present in the depletion region. The net charge at any given place in the drift region is given as:

$$N^+ = N_D + P - n$$

Where $N_D$ is the donor density, p is the hole concentration, and n is the electron concentration. The field near the bird's beak (point c) remains essentially the same due to presence of a comparable number of holes and electron carriers. The field inside the resurf region depends on the two dimensional distribution of carriers within the drift region. This field increases (point d) due to an increase in net positive charge. This electric filed inside the drift region is less than that under the bird's beak but applicants have discovered that it leads to an increase in breakdown voltage at high current.

Figure 6:
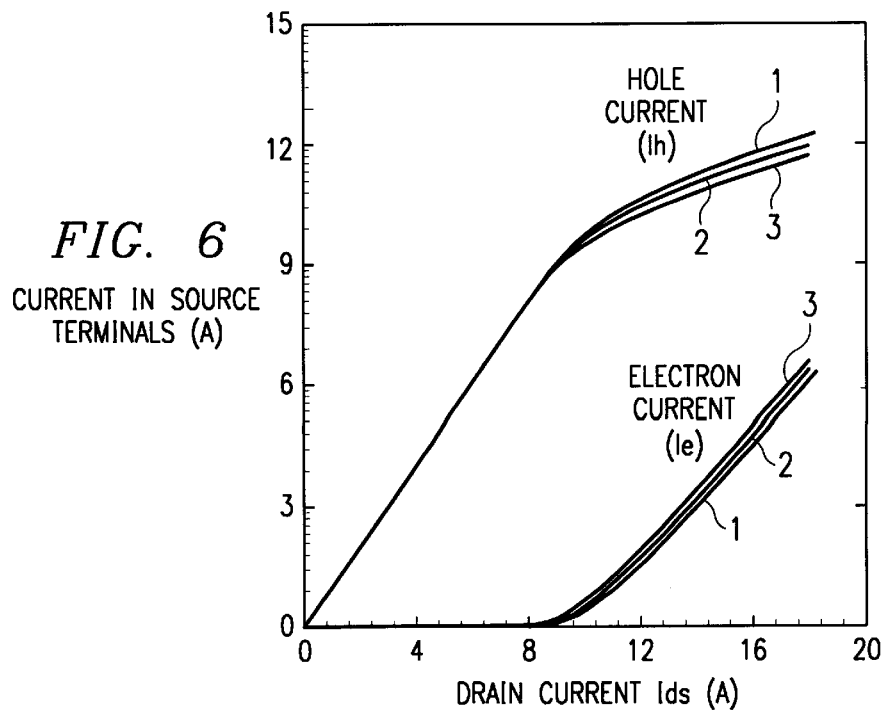
FIG. 6, shows hole and electron current during breakdown for the devices of FIG. 1 and FIG. 10.

FIG. 6, shows hole and electron current during breakdown. As can be seen from FIG. 6 and FIG. 3, the parasitic NPN transistor formed by n+ drain 24, p type regions 14 and 16, and n+ source region 22 turns on at lower current than the snap back current value.

Figure 7:
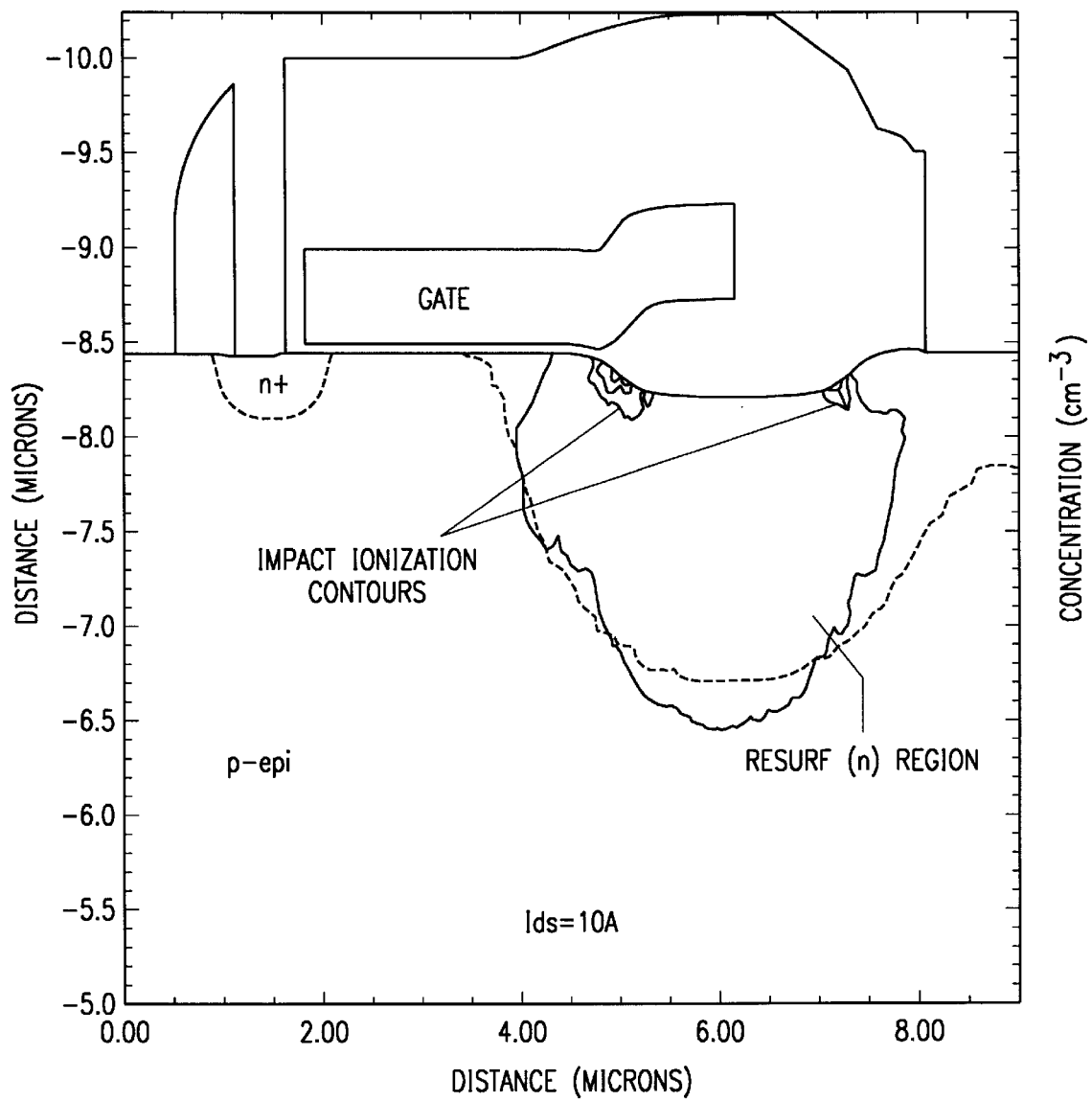
FIG. 7 shows the impact ionization rate for the device of FIG. 1 for Ids=10A, the snap back current of the device.

In addition to the BV of the parasitic NPN operating in the active region and the resurf region charge modulation, the snap back current also depends upon the impact ionization generation rate throughout the resurf region. FIG. 7 shows the impact ionization rate for the device of FIG. 1 for Ids=10A, the snap back current of the device. In addition to impact ionization near the bird's beak, the device of FIG. 1 shows a high impact ionization generation rate near the drain side.

Figure 8:
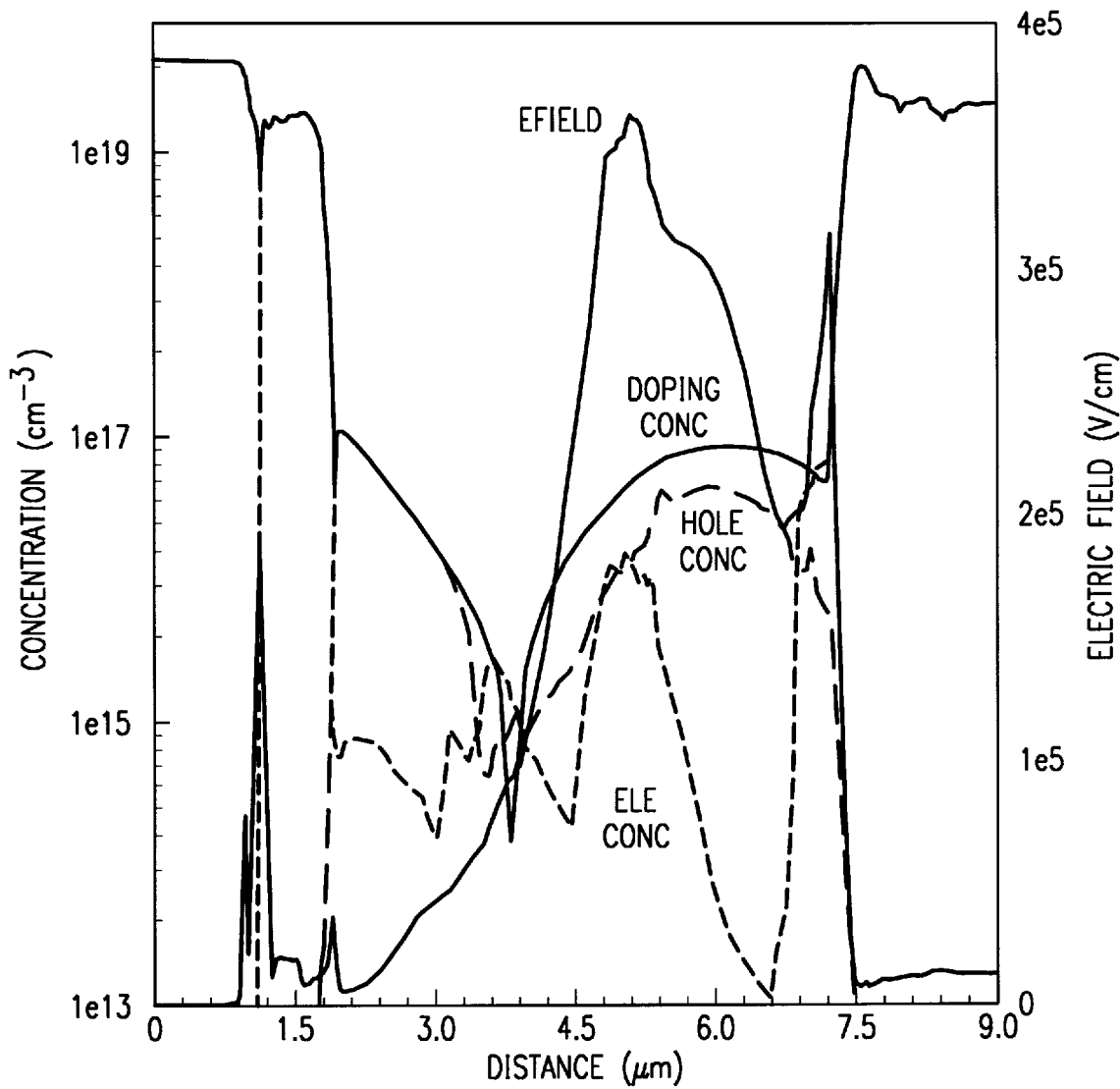
FIG. 8 shows a plot of doping concentration, carrier concentration and electric field profiles in the device of FIG. 1 near the surface for Ids=10A.

FIG. 8 shows a plot of doping concentration, carrier concentration and electric field profiles in the device of FIG. 1 near the surface for Ids=10A. The high impact ionization generation rate near the drain side in the device of FIG. 1 (seen in FIG. 6) causes an increase in hole concentration in the resurf region as seen in FIG. 7. In addition, the field near the bird's beak (point c) also increases dramatically.

Figure 9:
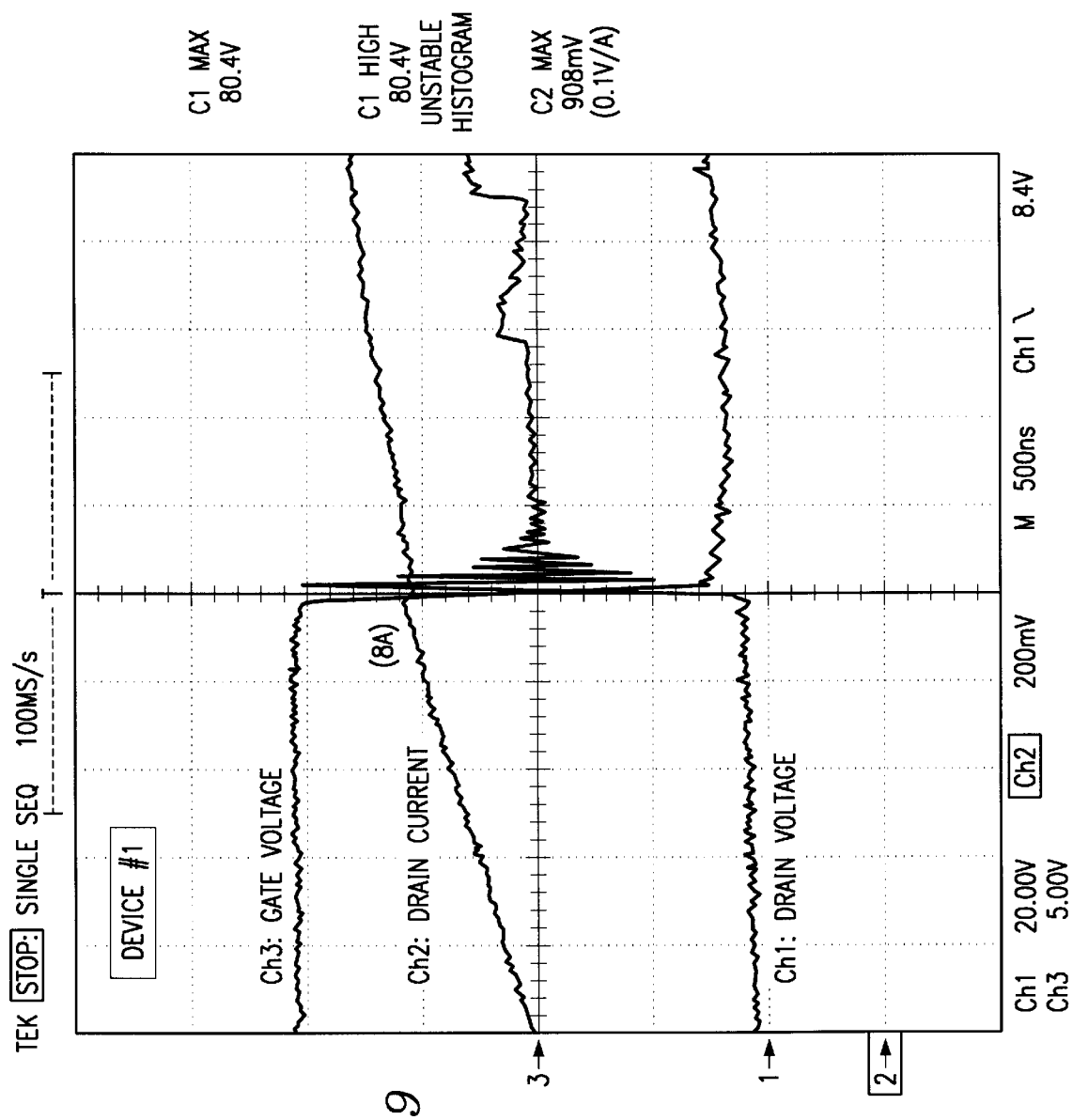
FIG. 9 is a plot showing the destructive UIS behavior of the device of FIG. 1.
Figure 10:
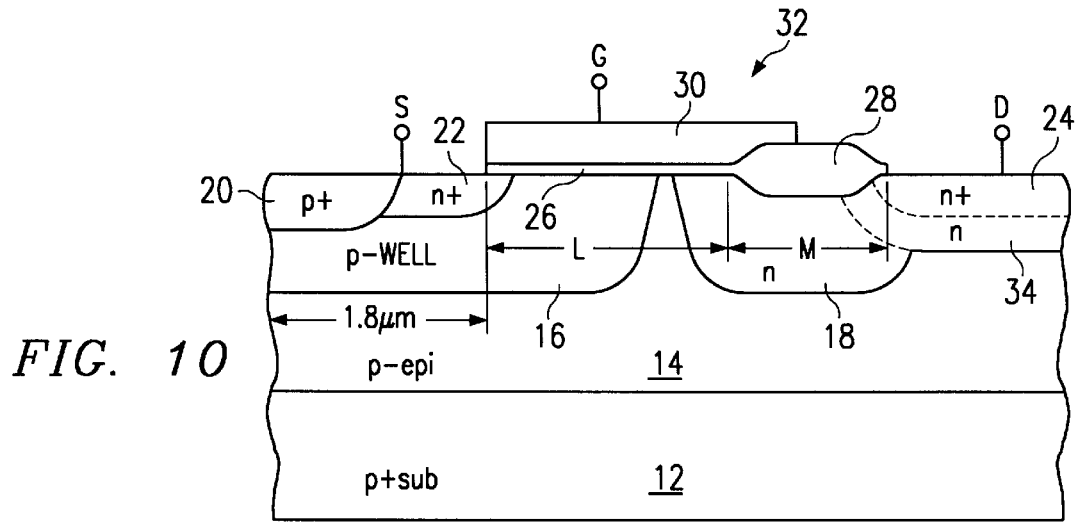
FIG. 10 shows an RLDMOS device in accordance with the present invention
Figure 11:
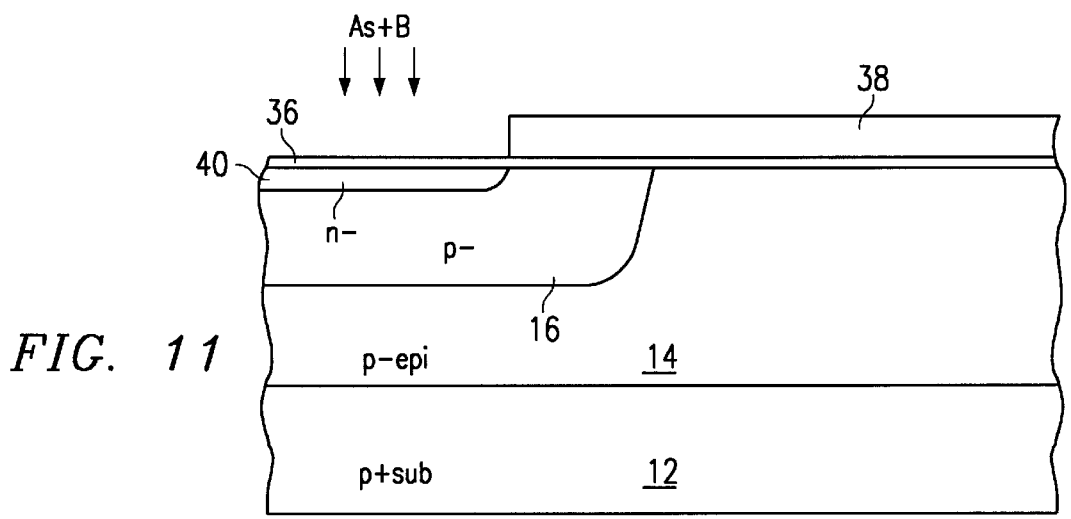
FIGS. 11–16 are cross-sectional elevation views showing the RLDMOS transistor of FIG. 10 at successive stages during fabrication.

FIG. 9 is a plot showing the destructive UIS behavior of the device of FIG. 1. As seen in FIG. 9, the device of FIG. 1 fails at 8–8.2A FIG. 10 shows an RLDMOS device 32 in accordance with the present invention. Device 32 is identical to device 10 of FIG. 1 with the exception that the drain region includes, in addition to n+ region 24, a deep drain n buffer implant region 34. Region 34 surrounds region 24.

FIGS. 11–16 are cross-sectional elevation views showing transistor 32 of FIG. 10 at successive stages during fabrication. As seen in FIG. 10, fabrication of LDMOS transistor 32 begins with the formation of p– epitaxial layer 14 on p+ substrate 12. A pad oxide layer 36 is then formed over p– epitaxial layer 14. A layer of photoresist 38 is deposited over oxide layer 36 and patterned and etched to expose a D well region. Implants of p and n type dopants, with the n type having substantially less diffusivity than the p type, such as arsenic and boron, are sequentially performed to form p– region 16 and n– region 40. Photoresist layer 38 is then removed.

Figure 12:
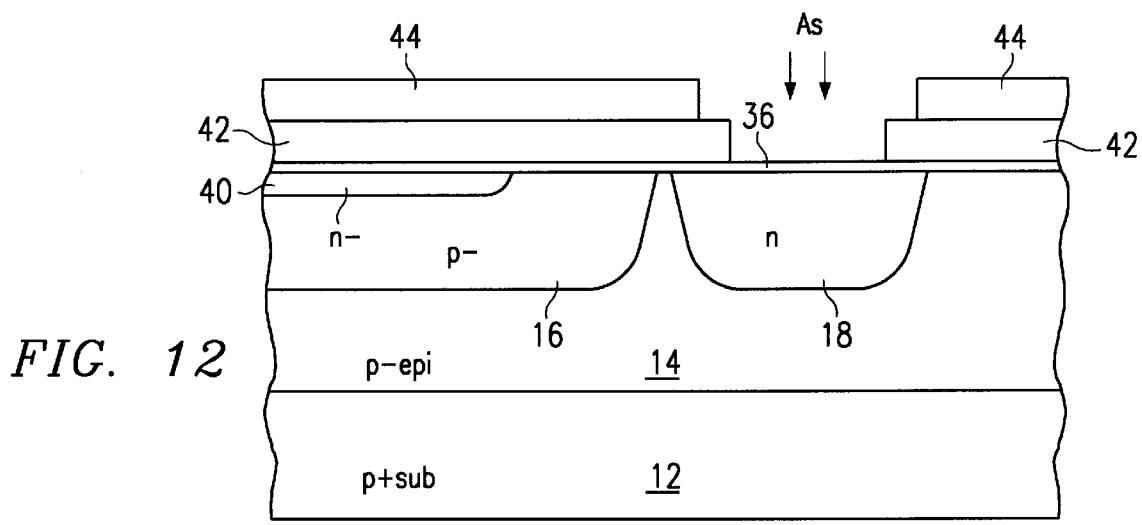

As seen in FIG. 12, nitride layer 42 and photoresist layer 44 are formed over oxide layer 36 and patterned and etched to expose a resurf region. An n type implant, using arsenic, for example, is performed to form resurf region 18.

Figure 13:
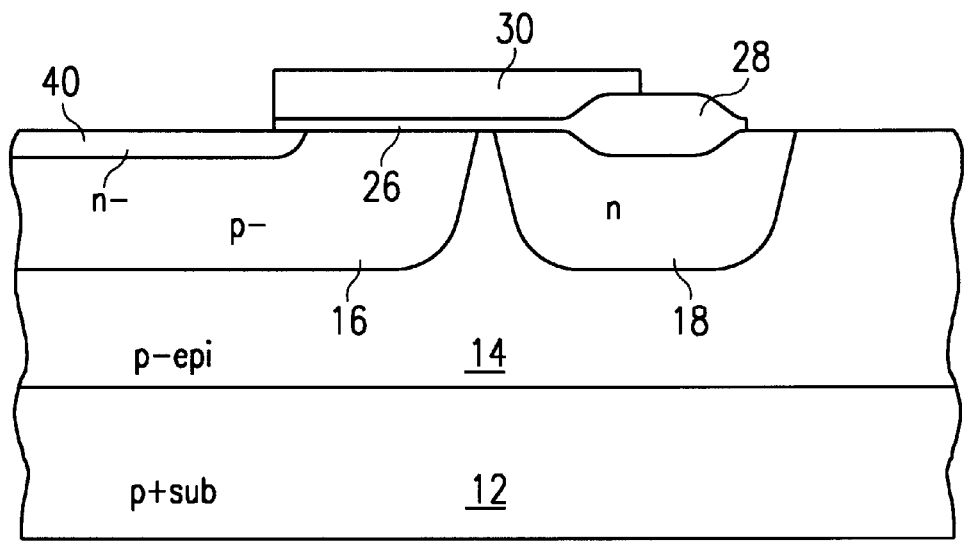

As seen in FIG. 13, field oxide region 28 is then hermally grown in the exposed region over resurf region 18. Resurf region 18 is thus self-aligned to field oxide region 28. Oxide and nitride layers 36 and 38 are then removed and a thin gate oxide layer 26 is formed over the face of epitaxial layer 14. A polysilicon layer is then deposited over gate oxide layer 26 and field oxide region 28 and patterned and etched to form gate 30.

Figure 14:
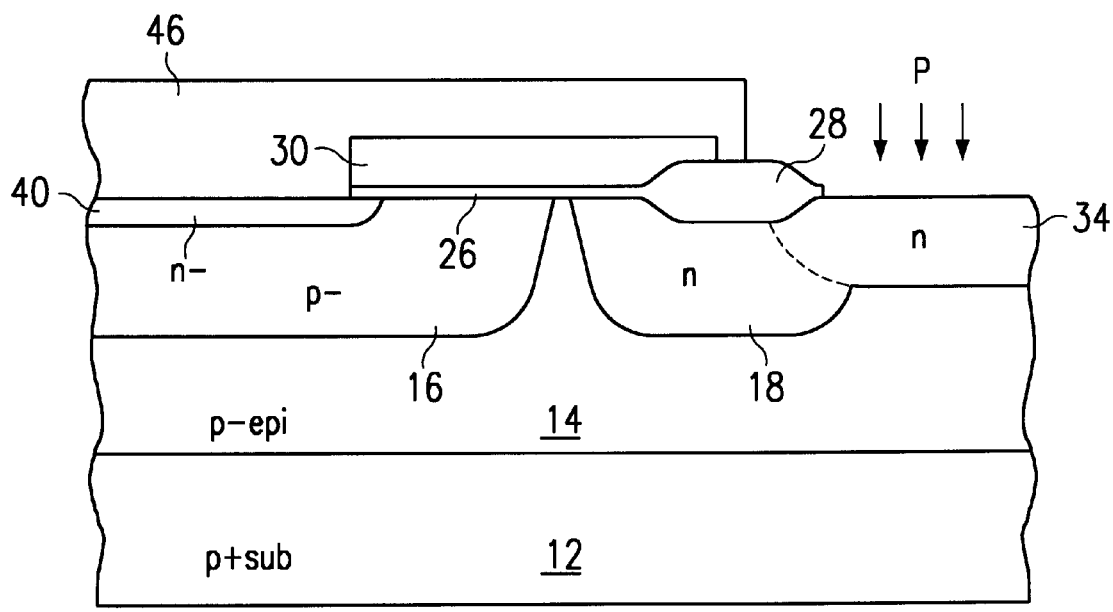

As seen in FIG. 14, a layer of photoresist 46 is formed over the device and patterned and etched to expose the drain region. An n type implant, using phosphorous, for example, is performed to form the deep drain n buffer region 34.

Figure 15:
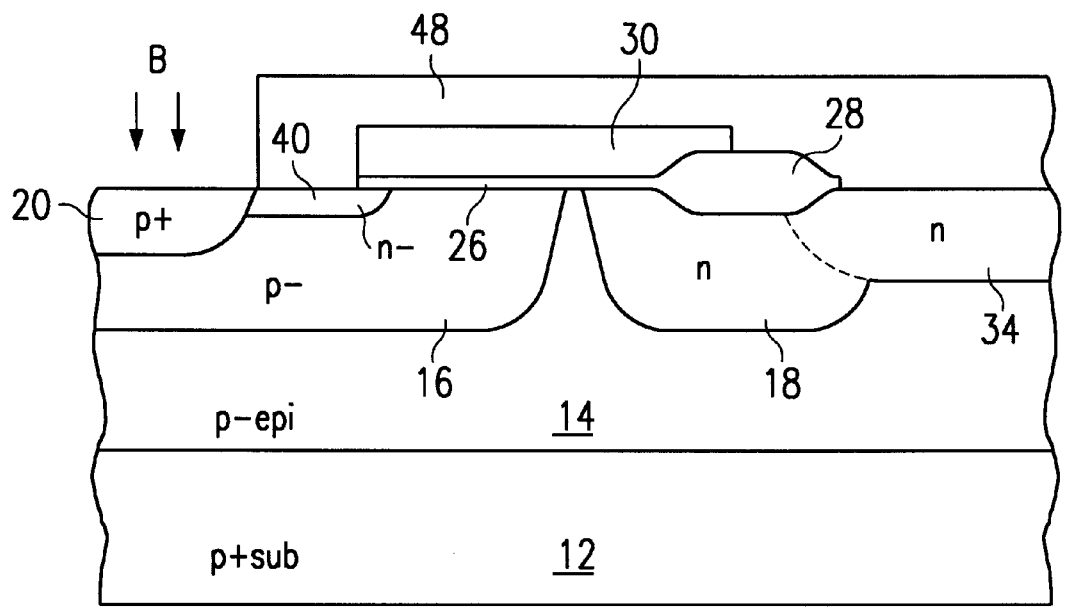

Photoresist layer 46 is then removed and a layer of photoresist 48 is then formed over the device and patterned and etched to expose the backgate contact region as shown in FIG. 15. A p type implant, using boron, for example, is then performed to form p+ backgate contact region 20.

Figure 16:
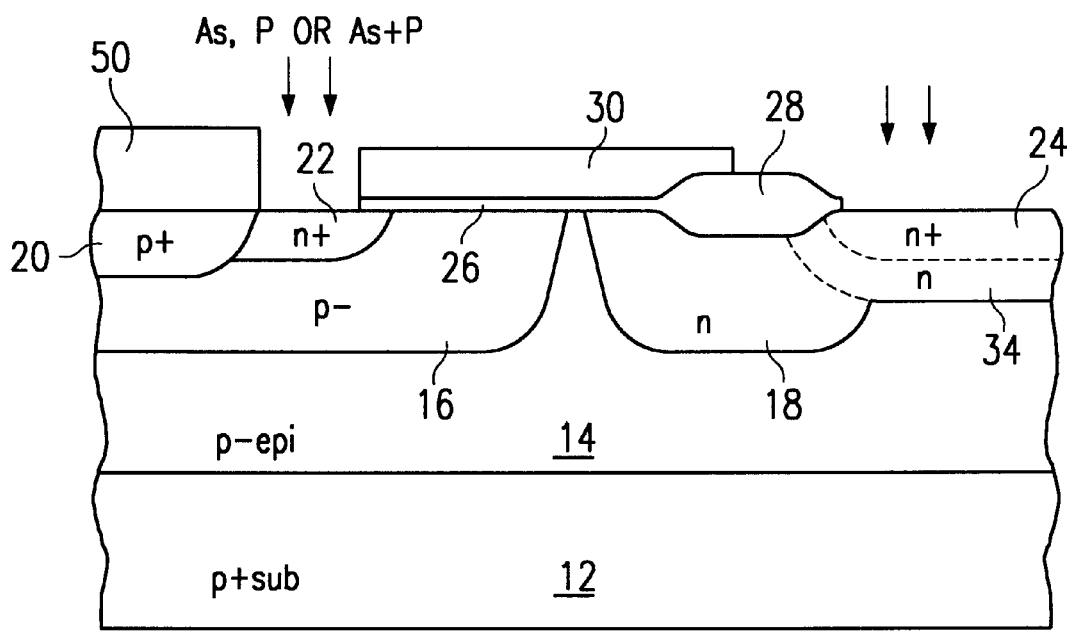

Photoresist layer 48 is then removed and a layer of photoresist 50 is then formed over the device and patterned and etched to expose the source and drain regions as shown in FIG. 16. An n type implant, using arsenic, phosphorous, or both, for example, is then performed to form n+ source region 22 and n+ drain region 24.

Figure 17:
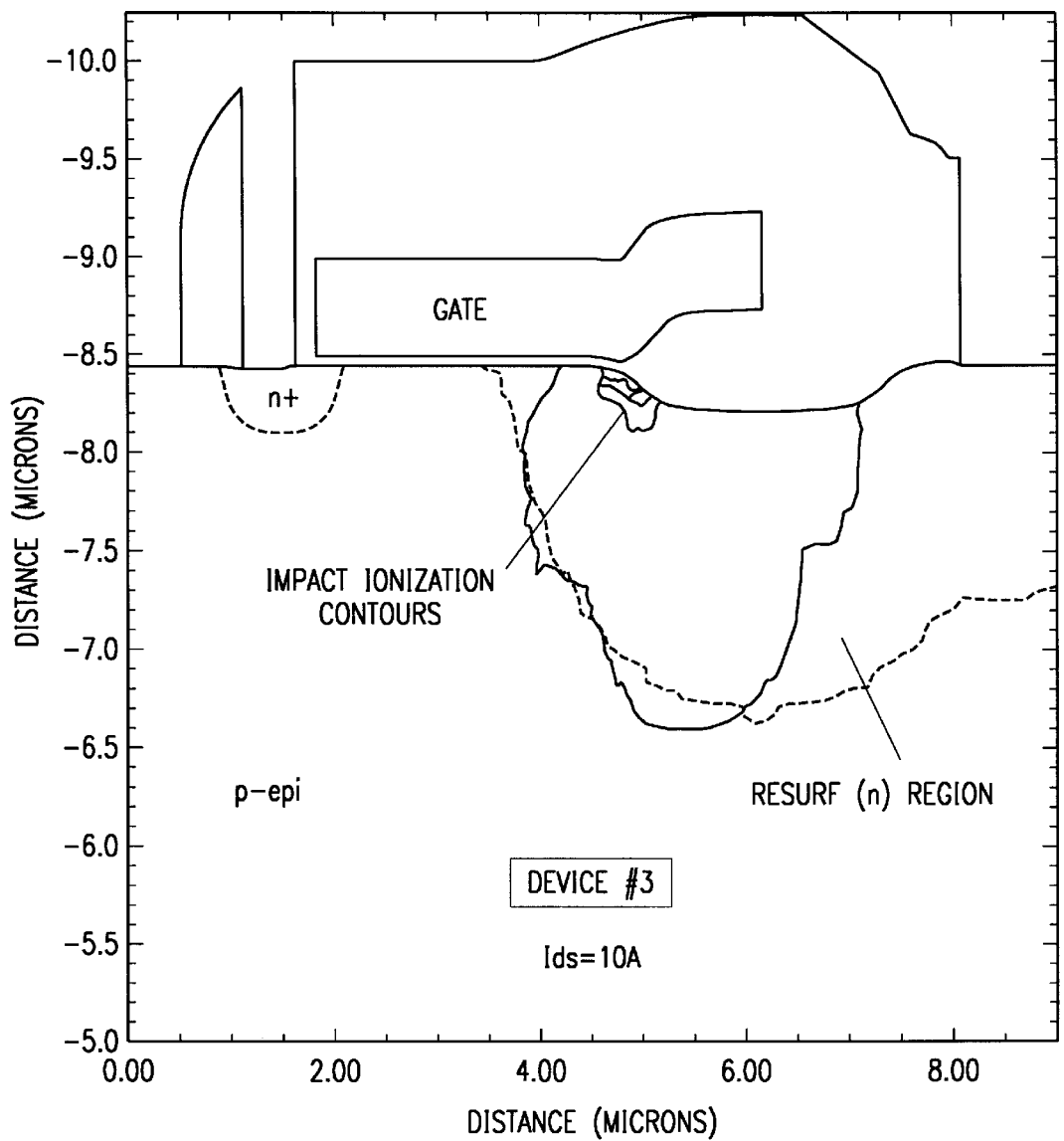
FIG. 17 shows a plot of doping concentration, carrier concentration and electric field profiles in the device of FIG. 10 at Ids=0A.

FIG. 17 shows a plot of doping concentration, carrier concentration and electric field profiles in the device of FIG. 10 at Ids=0A and having L=3.3 microns, M=2.3 microns, and area=8e–3cm². As seen in FIG. 17, the electric field crowding near the bird's beak of the drain side present in FIG. 8 (point c) has been reduced as has hole concentration in the resurf region.

Figure 18:
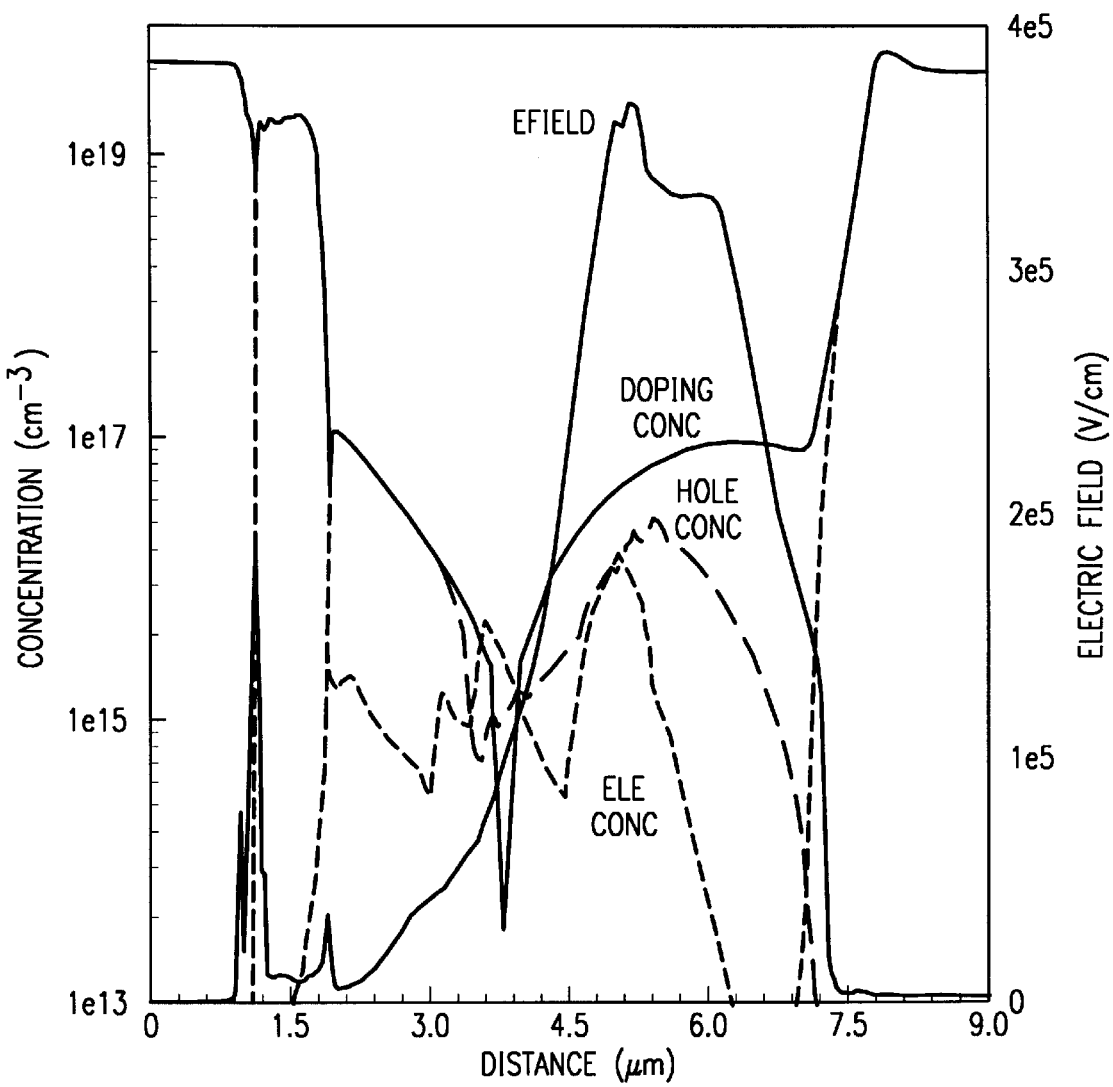
FIG. 18 shows the impact ionization rate for the device of FIG. 10 for Ids=10A.

FIG. 18 shows the impact ionization rate for the device of FIG. 10 for Ids=10A. As can be seen, the device of FIG. 10 has not snapped back. In addition to impact ionization near the bird's beak, is much lower than that of the device 10 of FIG. 1. This is due to the fact that the deeper drain side buffer implant region helps the depletion region to spread out reducing the electric field crowding near the bird's beak of the drain side.

The device of FIG. 10, when fabricated with the dimensions given above, has a snap back current of 15A and simulated breakdown curve shown at 3 in FIG. 3. The device of FIG. 10 can be fabricated with the same dimensions as the device of FIG. 1 (i.e. L=3.3 microns, M=2.0 microns, and area=8e–3cm²) and improvements in snap back current still result. In this case, snap back current is 11.3A and a simulated breakdown curve is shown at 2 in FIG. 3. With either set of dimensions, a significant improvement over the snap back current of 10A for the device of FIG. 1 results. The use of a longer drift region M produces a higher snap back current because the longer drift region helps produce a lower electric field and therefore a lower impact ionization rate near the drain side as the depletion region can spread out more.

Figure 19:
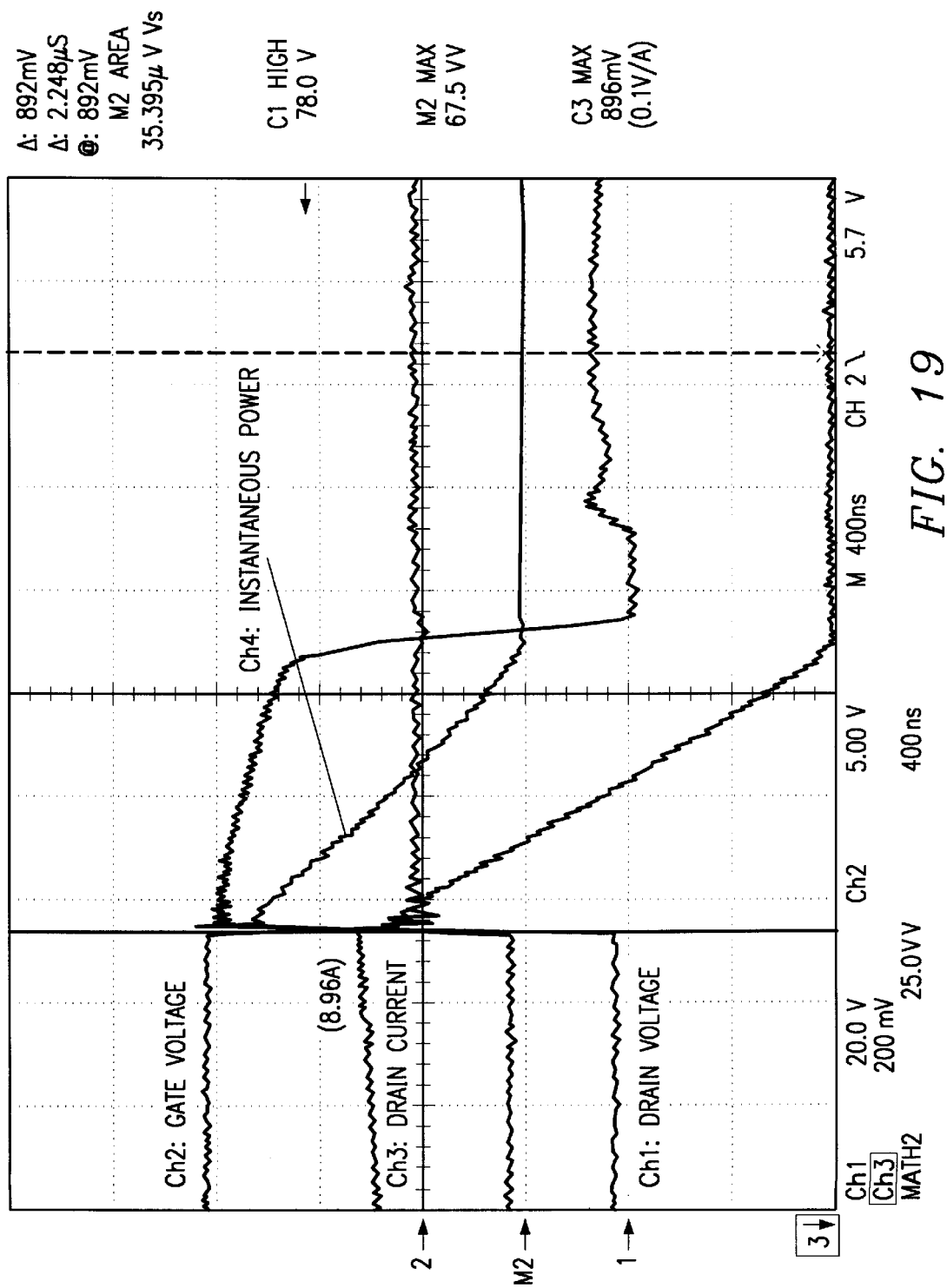
FIGS. 19 and 20 show the destructive UIS behavior of the device of FIG. 10.
Figure 20:
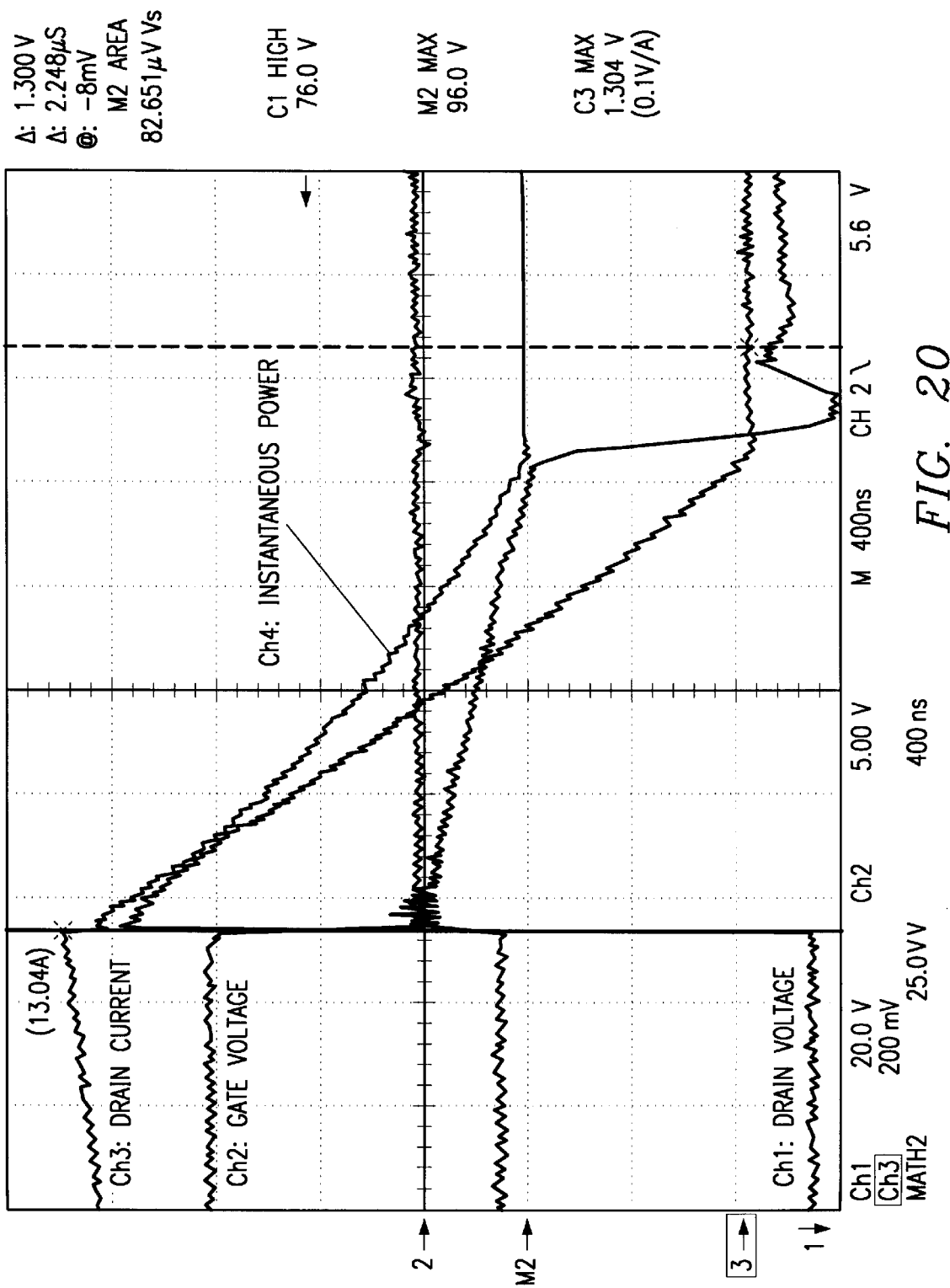

FIG. 19 shows the destructive UIS behavior of the device of FIG. 10, with L=3.3 microns, M=2.0 microns, and area= 8e−3cm². As seen in FIG. 19, the device fails at 99.5A. FIG. 20 shows the destructive UIS behavior of the device of FIG. 10, with L=3.3 microns, M=2.3 microns, and area=8e−3cm². As seen in FIG. 20, the device fails at 12.5–13A A preferred embodiment has been described in detail hereinabove. It is to be understood that the scope of the invention also comprehends embodiments different from that described, yet within the scope of the claims. For example, a RESURF LDMOS transistor 32 that is a PMOS transistor could be formed by changing regions of N type conductivity to P type and regions of P type to N type. In addition, instead of forming the RESURF LDMOS transistor directly in the epitaxial layer, it could be formed in a deep well in an epitaxial layer, the deep well being of the same conductivity type as the DWELL. The use of deep wells of opposite conductivity types would thus permit both PMOS and NMOS transistors to be formed on a single chip.

While this invention has been described with reference to an illustrative embodiment, this description is not intended to be construed in a limiting sense. Various modifications and combinations of the illustrative embodiment, as well as other embodiments of the invention, will be apparent to persons skilled in the art upon reference to the description. It is therefore intended that the appended claims encompass any such modifications or embodiments.

What is claimed is:

1. A transistor, comprising:
   a semiconductor layer of a first conductivty type;
   a RESURF region of a second conductivity type formed in the semiconductor layer, said RESURF region extending from the face of the semiconductor layer to a first distance below the face of the semiconductor layer;
   a LOCOS field oxide region formed at a face of the RESURF region, the RESURF region being self-aligned to the LOCOS field oxide region;
   a well of the first conductivity type formed in the semiconductor layer;
   a source region of the second conductivity type formed in the well, a channel region defined in the well between a first edge of the source region and a first edge of the RESURF region;
   a drain region of the second conductivity type formed in the semiconductor layer adjacent a second edge of the RESURF region, the drain region including a first region extending from the face of the semiconductor layer to a second distance below the face of the semiconductor layer and a second region surrounding the first region and extending a third distance below the face of the semiconductor layer, the first distance being greater than the third distance, the third distance being greater than the second distance, and the first region being more heavily doped than the second region; and
   a conductive gate formed over and insulated from the channel region.

2. The transistor of claim 1, in which the semiconductor layer is an epitaxial layer formed on a substrate of the first conductivity type.

3. The transistor of claim 1, in which the drain region has an edge that is self-aligned with an edge of the LOCOS field oxide region.

4. The transistor of claim 1, further comprising a backgate contact of the first conductivity type formed in the well adjacent a second edge of the source region.

5. The transistor of claim 1, in which the first conductivity type is P and the second conductivity type is N.

6. A transistor, comprising:
   a semiconductor layer of a first conductivity type;
   a RESURF region of a second conductivity type formed in the semiconductor layer, said RESURF region extending from the face of the semiconductor layer to a first distance below the face of the semiconductor layer;
   a well of the first conductivity type formed in the semiconductor layer;
   a source region of the second conductivity type formed in the well, a channel region defined in the well between a first edge of the source region and a first edge of the RESURF region;
   a drain region of the second conductivity type formed in the semiconductor layer adjacent a second edge of the RESURF region, the drain region including a first region extending from the face of the semiconductor layer to a second distance below the face of the semiconductor layer and a second region surrounding the first region and extending a third distance below the face of the semiconductor layer, the first distance being greater than the third distance, the third distance being greater than the second distance, and the first region being more heavily doped than the second region; and
   a conductive gate formed over and insulated from the channel region.

7. The transistor of claim 6, in which the semiconductor layer is an epitaxial layer formed on a substrate of the first conductivity type.

8. The transister of claim 6, further comprising a backgate contact of the first conductivity type formed in the well adjacent a second edge of the source region.

9. The transistor of claim 6, in which the first conductivity type is P and the second conductivity type is N.

* * * * *

UNITED STATES PATENT AND TRADEMARK OFFICE
CERTIFICATE OF CORRECTION

PATENT NO. : 6,211,552 B1
DATED : April 3, 2001
INVENTOR(S) : Taylor R. Efland, Sameer Pendharkar, Dan M. Mosher, Peter Chia-cu Mei, Robert B. Todd It is certified that error appears in the above-identified patent and that said Letters Patent is hereby corrected as shown below:

Title page,
Under "Filed: May 27, 1999" insert: -- Related U.S. Application Data Provisional application No. 60/086,894 May 27, 1999 --.

Column 1,
After line 3, insert: -- This application claims priority under 35 USC 119(e)(1) of the provisional application number 60/086,894, filed May 27, 1999. --

Signed and Sealed this

Eleventh Day of December, 2001

Attest:

*Nicholas P. Godici*

NICHOLAS P. GODICI
*Attesting Officer*  *Acting Director of the United States Patent and Trademark Office*